United States Patent [19]

Miller

[11] 4,069,478
[45] Jan. 17, 1978

[54] BINARY TO BINARY CODED DECIMAL CONVERTER

[75] Inventor: Anthony J. Miller, Bethesda, Md.

[73] Assignee: The United States of America as represented by the Administrator of the National Aeronautics and Space Administration, Washington, D.C.

[21] Appl. No.: 631,341

[22] Filed: Nov. 12, 1975

[51] Int. Cl.² ............................................. H03K 13/24
[52] U.S. Cl. ............................................. 340/347 DD
[58] Field of Search ................ 235/155; 340/347 DD

[56] References Cited

U.S. PATENT DOCUMENTS

| | | | |
|---|---|---|---|
| 3,026,034 | 3/1962 | Couleur | 235/155 |
| 3,257,547 | 6/1966 | Bernstein | 235/155 |
| 3,564,225 | 2/1971 | Watson | 235/155 |
| 3,943,350 | 3/1976 | Lanning | 235/155 |

FOREIGN PATENT DOCUMENTS 921,330   3/1963   United Kingdom ................. 235/155

Primary Examiner—Charles D. Miller
Attorney, Agent, or Firm—John R. Tresansky; Ronald F. Sandler; John R. Manning

[57] ABSTRACT

A binary coded input signal is converted to a binary coded decimal signal having N decades by employing N four bit shift registers. The bits of the input signal are sequentially supplied, in order, to the least significant position of the register for the units decade, with the most significant bit of the input signal being applied to the units register first. Each of the registers includes a right shift-parallel load mode control input terminal. In response to the sum of the values stored in each register and the binary value 0011 being less than the binary value 1000, the mode control input terminal is activated to shift the register contents one bit to the right. In response to the sum being greater than 1000, the mode control input terminal is activated to load the sum into the register. A binary one is loaded into the least significant bit position of the register for the adjacent higher decade in response to the sum being greater than 1000.

7 Claims, 2 Drawing Figures

BINARY TO BINARY CODED DECIMAL CONVERTER

ORIGIN OF THE INVENTION

The invention described herein was made by an employee of the United States Government and may be manufactured and used by or for the Government for governmental purposes without the payment of any royalties thereon or therefor.

FIELD OF INVENTION

The present invention relates generally to apparatus for converting a binary coded input signal to an output signal having a binary code of base K (where K is greater than 2) and more particularly to such a converter wherein a register for each of the K orders stores a value equal to the sum of the signal previously stored in the register and a predetermined value in response to the most significant bit of the sum having a binary one value.

BACKGROUND OF THE INVENTION

One known technique for converting a binary coded signal to an output signal having a binary code of base K (e.g., for converting a binary coded signal to a binary coded decimal signal, in which case $K = 10$) is reported by John F. Couleur in the December 1958 issue of the IRE Transactions on Electronic Computers, Volume EC-7, No. 7. For conversion into binary coded decimal, the prior art technique basically involves sequentially supplying bits of the binary coded input signal to the least significant bit position of the lowest order register of a plurality of cascaded four-bit shift registers. The bits are entered in order, with the most significant bit being entered first. After each bit has been entered the contents of each register are examined and, prior to the next shift, the binary value 0011 is added to the register contents. In response to the sum of the register contents and the binary value 0011 being less than the binary value 1000, no change is made in the contents of a particular register. However, if the sum of the register contents and the binary value 0011 is greater than the binary value 1000, the binary value 0011 is added to the register contents.

One prior art device for implementing the technique disclosed by Couleur is found on page 240 of the Texas Instruments publication entitled "Designing With Integrated Circuits". This prior art implementation utilizes relatively straightforward apparatus for adding the register contents with the values 0011 or 0000, depending upon whether the register contents are greater than 0100 or less than 0101. In particular, a logic network is provided to sense the contents of each register to determine if they are greater than 0100 or less than 0101. In response to the register contents being greater than 0100 the register contents are added to the binary value 0011 in a binary adder; the same binary adder adds the register contents to 0000 in response to the register contents being less than 0101. The logic network required for each register includes two NAND gates having two inputs, one NAND gate having three inputs, and an inverter. Hence, the prior art device uses a relatively large number of components to test the value of each register. The large number of components has a tendency to reduce the reliability of the device, as well as making the device somewhat difficult to construct and troubleshoot. Further, if it is desirable to perform a conversion from a binary coded signal to a binary coded signal having a base other than the ten's base, the conversion can be effected only by replacing each of the logic networks associated with each register. Such a replacement is necessary because it is necessary to test the contents of the register against a different number, depending upon the order to which the binary signal is to be converted.

It is, accordingly, an object of the present invention to provide a new and improved apparatus for converting binary coded input signals into binary coded output signals having an order greater than two.

It is another object of the invention to provide a new and improved binary to binary coded decimal converter wherein the value of each decade is selectively added to the binary value 0011, depending upon whether the value of the decade is greater than 0100 or less than 0101.

A further object of the invention is to provide a new and improved binary to binary coded decimal converter wherein a relatively small amount of hardware is used to determine if the signal valve for each decade is equal to or greater than 0101, thereby to provide increased reliability and ease of troubleshooting.

An additonal object of the invention is to provide a new and improved apparatus for converting a binary coded input signal to an output signal having a binary code of base K, where K is greater than two, wherein the apparatus is readily adapted to convert the input signal to output signals of different bases.

BRIEF DESCRIPTION OF THE INVENTION

In accordance with the present invention, a binary coded input signal is converted to an output signal having a binary code of base K and order N, where K is greater than two, by adding the binary signal for each order to a predetermined value and responding to the most significant bit resulting from the addition to determine if the binary signal for the order is to be modified to be equal to the sum of the signal and the predetermined value. In the particular application of converting a binary code decimal output signal having N decades, N four bit shift registers are provided. The bits of the binary coded input signal are sequentially supplied in order to the least significant bit position of the units decade register, with the most significant bit of the input signal being supplied first. Each of the registers is provided with a right shift-parallel load mode control input terminal or means. A full adder is provided for each register and is responsive to the sum of the values stored in each of the registers, as well as the binary value 0011. The full adder activates the mode control input means of its associated register to shift the register contents one bit to the right in response to the sum being less than the binary value 1000. The full adder activates the mode control input means of its associated register to load the sum of the values stored in its associated register and the binary value 0011 into the register in response to the sum being greater than the binary value 1000. In response to the sum being greater than 1000, a binary one is loaded into the least significant bit position of the register for the adjacent higher decade.

The determination as to whether the sum of the values stored in each of the registers and the binary value 0011 is less than 1000 is made merely by examining the most significant bit value of the full adder output, thereby obviating the need for a logic circuit including several AND gates and an inverter at the input of the adder, as in one of the prior art configurations. Thereby, there is a considerable reduction in the hardware required for the present invention; the hardware reduction results in lower cost, greater reliability, and ease in troubleshooting. Further, by testing the most significant bit position of the output of the adder, rather than testing the register contents to determine if they are greater than 0100, the present apparatus is capable of being easily modified so that it can convert a binary coded signal into a binary coded output signal having any desired order greater than two.

In accordance with a further feature of the invention, a binary zero is initially loaded into each position of each shift register in a relatively short time interval, without requiring the power associated with simultaneously loading a zero into all of the register stages simultaneously. In particular, a binary zero is loaded into the first position or stage of each register while four clock pulses are being supplied in parallel to the registers and the mode control input means of each register is activated to the right shift state. To enable the registers of all but the units order to be so initially activated, an AND gate is connected to be responsive to a mode control source to supply a binary zero to a mode control input of order M to a shift input terminal of the register for order M+1. The same AND gate is responsive to a binary one input from the mode control source while the conversion operation is being performed, to selectively supply binary ones and zeros to the mode control input terminal of the register for order M and the shift input terminal of the register for order M+1. To enable the units order register to be initially loaded with binary zeros, a register is provided between a serial source of the binary signal to be decoded; the register injects four binary zeros into the binary coded signal to be encoded prior to the most significant bit being supplied to the shift input of the units register.

It is an additional object of the invention to provide a binary to binary coded decimal converter wherein the same gate is utilized to control shifting and addition within a register during a conversion operation and to control the initial loading of the registers prior to a conversion operation being performed.

The above and still further objects, features and advantages of the present invention will become apparent upon consideration of the following detailed description of one embodiment thereof, especially when taken in conjunction with the accompanying drawing.

DETAILED DESCRIPTION OF THE DRAWING

Figure 1:
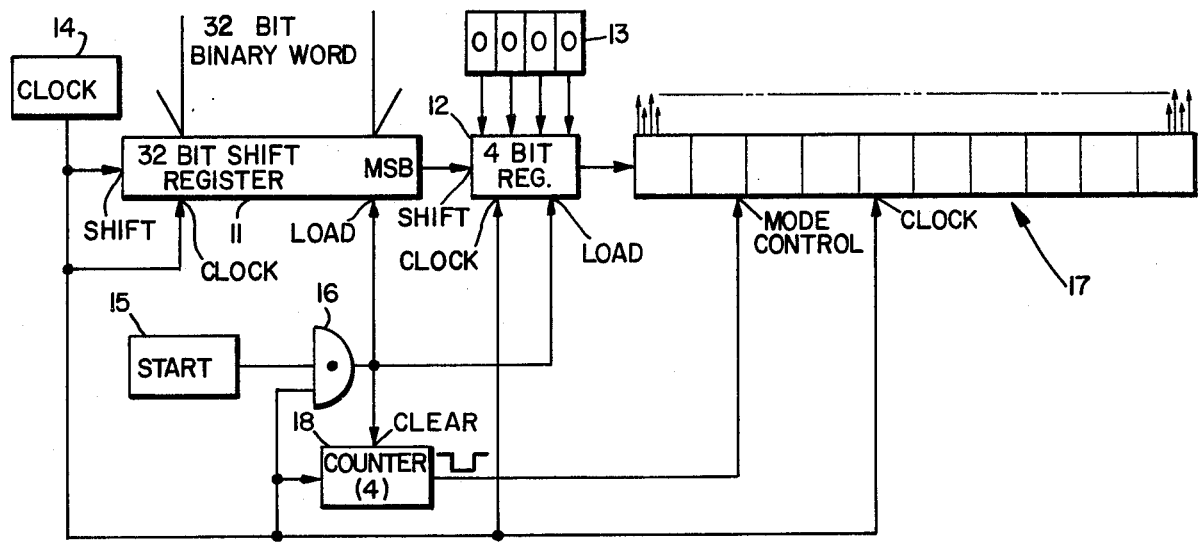
FIG. 1 is a block diagram of the converter and its input and control mechanism.

Reference is now made to FIG. 1 of the drawing wherein there is illustrated apparatus for converting a 32-bit binary coded word signal into an 40-bit binary coded decimal word signal, i.e., a binary coded decimal word having ten decades, each of which includes four bits. The 32-bit binary coded word is derived from a suitable source, such as a digital computer, and is applied to a 32-bit shift register 11, with the most significant bit of the word being applied to the right-most or last stage or the shift regiseter and the least significant bit being applied to the leftmost stage or zero stage of the register. The last stage of register 11 is connected to supply an input to the lowest order stage of 4-bit shift register 12. Initially, the four stages of register 12 are loaded in parallel with binary zeros from a binary zero source 13.

To selectively load the 32-bit binary coded word and the four binary zeros into the respective stages of registers 11 and 12, both of the registers are provided with a load input terminal; the registers are initially loaded in response to a binary one being applied to the load input terminals thereof. In response to a binary zero being applied to the load input terminals of registers 11 and 12, the registers are not responsive to the signals applied to their parallel inputs; instead, registers 11 and 12 are shifted in response to sequentially derived pulses derived from clock source 14, the output of which is applied to clock or shift inputs of the registers. In response to each clock pulse from source 14, the signals in the different stages of registers 11 and 12 are shifted one position to the right. Thereby, there is derived from the most significant bit stage of register 12 a sequence of thirty-six binary bits, with the first four bits invariably having a binary zero value, and the remaining thirty-two bits being commensurate with the binary bits of the binary coded word loaded into register 11.

To control loading into registers 11 and 12, a start signal source 15 is provided. When it is desired to begin a new conversion operation, start signal source 15 derives a binary one output level that subsists for a duration equal to the period of one cycle of clock source 14. To assure synchronization between the output signal of start source 15 and clock source 14, the two sources feed AND gate 16, having an output which drives the load inputs of registers 11 and 12 in parallel.

The serial output signal derived from the most significant bit stage of register 12 is supplied to the binary to binary coded decimal converter 17 of the present invention. Converter 17 includes ten shift registers, each of which includes four stages; one of the registers is provided for each of the ten decades of the binary coded decimal output signal. All of the stages of converter 17 are cleared to zero while the four initial binary zero pulses are derived from register 12 so that each of the stages of converter 17 of all of the registers is loaded with a binary zero value prior to the acutal conversion process beginning. To this end, counter 18, having a maximum count of four, is provided. Counter 18 includes a clear input terminal responsive to the output of AND gate 16, whereby the counter is reset to zero while registers 11 and 12 are initially loaded. Thereafter, counter 18 responds to four clock pulses from source 14 to derive a binary zero level for a duration equal to the period of four cycles of clock source 14. Counter 18 derives a binary one during the entire conversion interval, and does not return to the binary zero state until it is cleared again by the output of AND gate 16. The output of counter 18 is applied as a mode control input to converter 17, whereby the converter is loaded while the counter derives a binary zero output; the converter performs its desired binary coded decimal conversion function while counter 18 derives a binary one level. Converter 17 is also responsive to the output of clock source 14 so that the binary signal stored in each of the ten shift registers is shifted right one position within its respective shift register in response to the trailing edge of each pulse from clock pulse 14. Converter 17, upon completion of the conversion operation, derives a 40-bit output word, consisting of ten decades, each having four bits.

Figure 2:
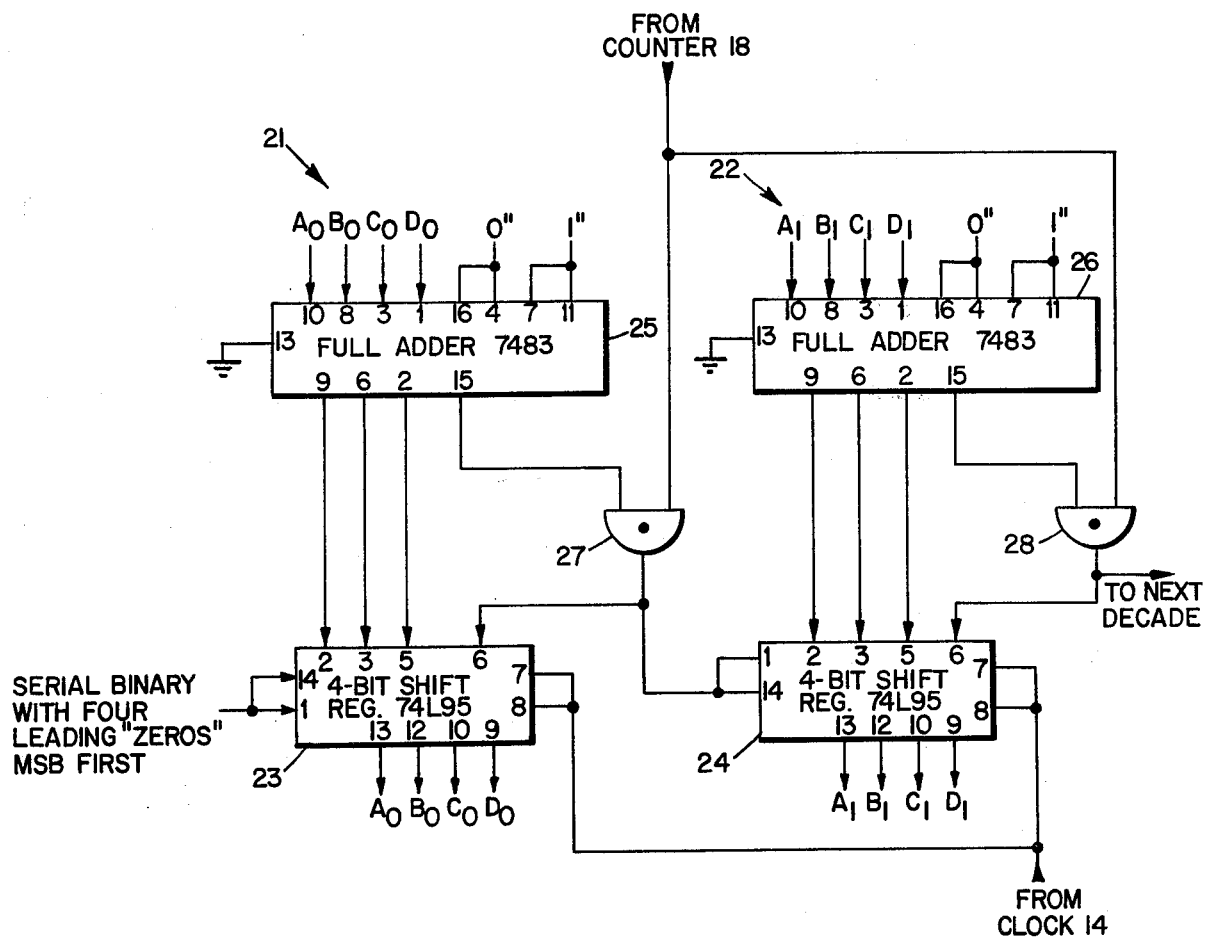
FIG. 2 is a block diagram of the units and ten stages of a binary to binary code decimal converter in accordance with the invention.

Reference is now made in FIG. 2 of the drawing wherein there are illustrated the first two decades 21 and 22 of converter 17, i.e., the units and tens decades of the thirty two bit decade converter. Each of units and tens decade stages 21 and 22 includes a four-bit shift register and a four-bit, two word binary full adder; the registers for stages 21 and 22 are respectively denominated 23 and 24, while the adders of stages 21 and 22 are respectively denominated with reference numerals 25 and 26.

Registers 23 and 24 include four parallel input pins 14, 2, 3, and 5 for the least to most significant bits, as well as output pins 13, 12, 10, and 9 for the least to most significant output bits; i.e., pins 14 and 13 are provided for the least significant bits of the inputs and outputs, pins 2 and 12 are provided for the second least significant bits of the inputs and outputs, pins 3 and 10 are provided for the third least significant bits of the inputs and outputs, and pins 5 and 9 are provided for the most significant bits outputs of the inputs and outputs. A shift or serial input pin 1 is connected in parallel to parallel input pin 14; left shift and right shift pins 7 and 8 are connected in parallel to each other to be responsive to clock pulses from source 14. Mode control pin 6 controls shifting of bits from the least significant bit position to the adjacent higher position within the register, or to enable signals to be loaded from the parallel input pins 14, 2, 3, and 5 of the register to the register stages; the shifting operation occurs in response to a binary zero level on pin 6 during the negative going edge of each pulse from clock source 14; the parallel load operation is performed in response to a binary one level on pin 6 during the negative going trailing edge of each pulse from clock source 14. In one preferred configuration, registers 23 and 24 are Texas Instrument 74L95 registers.

Each of adders 25 and 26 includes pins 10, 8, 3, and 1 responsive to the least to most significant bits of a first binary word derived from pins 13, 12, 10, and 9 of the register for the corresponding decade. Adders 25 and 26 also include pins 16, 4, 7, and 11 responsive to a second four-bit binary word having a constant value, equal to 0011 for conversion to binary coded decimal. To this end, pins 16 and 14 are connected together to a binary zero source, while pins 7 and 11 are connected together to a binary one source. Each of the adders 25 and 26 includes a grounded, carry input pin 13, as well as four output pins 9, 6, 2, and 15 on which are derived the least to most significant bits of the modulo sixteen sum of the two input words fed to the particular adder. In one preferred embodiment, adders 25 and 26 are Texas Instrument SN7483 four-bit binary full adders.

Each of adders 25 and 26 responds to the two binary words applied to its inputs to derive a binary one level at its most significant bit output pin 15 in response to the word read out from its corresponding register 23 or 24 having a value of more than 0100 (decimal 4); in the opposite manner, a binary zero level is derived on the most significant bit output pin 15 of adders 25 and 26 in response to the binary word read from its corresponding register having a value of less than 0101 (decimal 5). This result is apparent because of the addition of 0011 in adders 25 and 26 to the contents of registers 23 and 24.

The three least significant bit signals derived from full adders 25 and 26 are respectively applied to the three most significant bit parallel pins of registers 23 and 24; i.e., pins 9, 6, and 2 of registers 25 and 26 are respectively connected to pins 2, 3, and 5 of registers 23 and 24. The most significant bit signals derived from registers 25 and 26, on pins 15, are supplied to the mode control input terminals 6 of registers 23 and 24 via AND gates 27 and 28 while the converter is in a conversion mode, a result achieved by feeding the binary one output of counter 18 (FIG. 1) to enable inputs of gates 27 and 28. Thereby, in response to adder 25 or 26 deriving a binary one output of most significant bit output pins 15, registers 23 and 24 are activated to load the three least significant bit outputs of adders 25 and 26 into the three most significant bit stages of registers 23 and 24. The output signal of AND gates 27 and 28 are applied to the serial and parallel input pins 1 and 4 of the tens and hundreds decades of converter 17; the connection from AND gate 28 to the converter of the hundreds decade is not illustrated since only two decades of the converter are illustrated.

The higher order converter stages have internal circuits and connections identical to those for stage 22. Connections between adjacent higher order stages, e.g., between stages M and (M+1) are the same as illustrated for stages 21 and 22. These connections enable the least significant bit position of the register of each stage to be loaded with a binary one in response to the adjacent, preceding decade having a value greater than 0100. Hence, in response to register 23 storing a value greater than 0100, a binary one is loaded into the first stage of register 24.

The lowest order stage of shift register 23 is sequentially responsive, in order, to the four initial binary zeros and to the bits of the 32-bit binary coded word, with the most significant bit being initially applied to the first stage of register 23. To this end, pins 1 and 14 of register 23 are connected to the most significant bit stage of register 12.

To provide a better understanding of the functioning of the converter of the present invention, an example of the operation will be considered. Assume that the binary coded word 11110 (decimal 30) is to be converted to a binary coded decimal word which has the value 0011–0000 for the tens and units decades, respectively. Assume, for the purposes of simplicity, that the converter only includes two decades so that the 32-bit shift register 11 of FIG. 1 is replaced with a five-bit register and the 40 bit converter 17 is replaced with an eight-bit converter. Also assume that the input terminals of the most significant to least significant bit stages of the five-bit register have been supplied with the binary bits 11110, and that the four parallel input terminals of the intermediate register 12 have all been supplied with binary zeros. In response to a binary one output of AND gate 16, the stages of the 5-and 4-bit registers are respectively loaded with the words applied to their inputs. In response to the clock pulse from source 14 that occurs immediately after the binary one level is derived from AND gate 16, counter 18 derives a binary zero level to disable AND gates 27 and 28. With AND gates 27 and 28 disabled, the first binary zero from the most significant stage of register 12 is supplied to pins 1 and 14 of register 23, causing the least significant bit stage of register 23 to be loaded with a binary zero. Simultaneously, a binary zero is derived from AND gate 27 and supplied to pins 1 and 14 of register 24, whereby the least significant stage of register 24 is loaded with a binary zero. In response to the next three clock pulses from source 14, binary zeros are similarly supplied to pins 1 and 14 of registers 23 and 24. Because the mode control signals applied by gates 27 and 28 to pins 6 of registers 23 and 24 are both zeros, the zeros loaded into the least significant bit stages of the registers are shifted to the right in response to each clock pulse from source 14. Thereby, upon the conclusion of the first four clock pulses from source 14, each of registers 23 and 24 has a binary zero in each of its four positions; also the four stages of register 12 are loaded with the four most significant bits of the binary word to be encoded because of the shifting operation from register 11 to register 12 in response to each clock pulse from source 14.

After the fourth clock pulse has been derived, counter 18 derives a binary one level and enable signals are applied to one of the inputs of each of AND gates 27 and 28. Thereby, AND gates 27 and 28 can selectively couple the output signals at pins 15 of adders 25 and 26 to the mode control input pins 6 of registers 23 and 24, respectively.

In response to the next (fifth) clock pulse from source 14, the most significant bit of the binary coded word to be encoded into a binary coded decimal word is coupled from the most signficant bit stage of register 12 to pins 1 and 14 of register 23. In the cited example, a binary one is coupled to pins 1 and 14 of register 23 and the least significant bit stage of register 23 is storing a binary one value. In response to the trailing edge of the fifth clock pulse, the binary one level at pin 13 of register 23 is coupled to pin 10 of adder 25. Adder 25 responds to the 0001 inputs respectively applied to its pins 1, 3, 8, and 10, as well as the 0011 signal applied to its pins 16, 4, 7, and 11 to derive a binary zero output on pin 15. Thereby, a binary zero is derived from AND gate 27 and no input can be supplied to parallel input pins 2, 3, and 5 of register 23. Hence, register 23 remains in the same state it previously had, with zeros in its three most significant bit stages and a one in its least significant bit stage.

In response to the next (sixth) clock pulse, a binary one signal is again applied to pins 1 and 14 of register 23 while a clock pulse is supplied to pins 7 and 8 of the register. The clock pulse causes the binary one loaded in the least significant bits stage of register 23 to be shifted to the second least significant bits stage, while the least significant bit stage of the register is loaded with a binary one signal. The binary one signals in the least and second least significant stages of register 23 are respectively read from pins 13 and 12 to pins 10 and 18 of adder 25, in response to the trailing edge of the clock pulse. Adder 25 responds to the binary one levels at its input pins 10 and 8, as well as the binary one levels at its input pins 7 and 11, to derive an output signal respectively having the values 0110 on pins 15, 2, 6, and 9. The binary zero level on pin 15 is coupled by AND gate 27 to mode control input pin 6 of register 23, whereby the register is unresponsive to the signals at pins 9, 6, and 2 of register 25.

In response to the next (seventh) clock pulse, a binary one is again fed in parallel to pins 1 and 14 of register 23 whereby the three least significant bit stages of register 23 are all loaded with binary ones, while the most significant bit stage of the register is loaded with a binary zero. In response to the trailing edge of the output of clock source 14, the binary values 1110 are coupled from pins 13, 12, 10, and 9 of register 23 to pins 10, 8, 3, and 1 of adder 25. Adder 25 responds to the signals at its input pins to derive binary bits respectively having the values 1010 on output pins 15, 2, 6, and 9. The binary one level on most significant bit output pin 15 is coupled through AND gate 27 to mode control input pin 6 of register 23 so that pins 2, 3, and 5 of register 23 are respectively responsive to the 010 outputs of pins 9, 6, and 2 of adder 25. Thereby, in the interval between the trailing and leading edges of the seventh and eighth clock pulses the least to most significant bits stages of register 23 respectively store the binary values 1010. The binary one value in the least significant bit stage of register 23 occurs because the clock input of register 12 is, during this interval, a binary one value and an output signal is derived from the most significant bit stage of register 12 during this interval. Simultaneously with a binary one signal being supplied to pin 6 of register 23, AND gate 27 supplies a binary one input to pins 1 and 4 of register 24. Thereby, the least significant bit position of register 24 is loaded with a binary one while the next (eighth) clock pulse is being derived.

While the eighth clock pulse is being derived, a binary one level is supplied to pins 1 and 14 of register 23 by the most significant bit position of registors 12. Thereby, the least to most significant bit stages of registers 23 are now respectively loaded with the binary values 1010. Thereby, in response to the trailing edge of the eighth clock pulse, pins 13, 12, 10, and 9 of register 23 respectively supply the binary bits 1010 to pins 10, 8, 3, and 1 of adder 25. Adder 25 responds to its two input signals to derive the binary bits 0001 on its output pins 9, 6, 2, and 15, respectively. The binary one value on most significant bit pin 15 is coupled by AND gate to mode control input pin 6 of register 23 and to pins 1 and 14 of register 24. In response to the binary one value coupled to pin 6 of register 23, binary zero levels are loaded into the three most significant bit stages of register 23 (by virtue of the connection of pins 9, 6, and 2 of adder 25 to pins 2, 3, and 5, respectively, of register 23) and a binary zero is loaded into the least significant bit stage of register 23. The binary one level is coupled by AND gate 27 to the least significant bit stage of register 24 and is clocked into that stage in response to the leading edge of the next (ninth) clock pulse from source 14.

The ninth clock pulse from source 14 also causes the binary one stored in the least significant bit stage of register 24 to be transferred to the second least significant bit stage of register 24. Thereby, the two least significant bit stages of register 24 store binary ones during the ninth clock pulse. When the ninth clock pulse is being derived, the most significant bit output of register 12 has a binary zero level, whereby a binary zero is shifted into the least significant bit position of register 23 during the ninth clock pulse. In response to the ninth clock pulse the 000 values previously stored in the three least significant bit stages of register 23 are shifted right one position and the zero value supplied to pins 1 and 14 is loaded into the least significant bit position of register 23. Hence, when the trailing edge of the ninth clock pulse occurs, the most to least significant bit positions of register 24 are storing the binary values 0011, while register 23 is storing the values 0000. These binary values are read out from registers 23 and 24 to the register output pins 9, 10, 12, and 13 to indicate the binary coded decimal value 0011-0000 (decimal 30).

While the specific embodiment has been described in connection with a binary coded to binary coded decimal converter, it is to be understood that the principles can be extended to convert a binary coded signal to a signal having a coded form of any base. To convert to any even base, it is only necessary to add a different number to the number stored in registers 23 and 24. In general, for any even base, the number to be added to the number in register 23 or 24 is (16 − base/2). Such a change is easily implemented, merely by changing the magnitude of the binary signal applied to pins 11, 7, 4, and 16 of adders 25 and 26. For the specific binary to binary coded decimal converter, wherein the base = 10, the number is ((16 − 10)/2) = 3; for a base of 8, the number is (16 − 8)/2) = 4. Adding 4 is easily implemented by supplying a binary one level to pin 4 of adders 25 and 26, and by supplying a binary zero to pins 11, 7, and 16 of the adders. If the order or base equals eight, the decision as to whether registers 23 and 24 are to be responsive to the signals applied to pins 2, 3, and 5 and whether a binary one is to be supplied to the least significant bit stage of register 24, is made merely by inspecting the binary value of the most significant bit outputs of adders 25 and 26, at pins 15.

While there has been described and illustrated one specific embodiment of the invention, it will be clear that variations in the details of the embodiments specifically illustrated and described may be made without departing from the true spirit and scope of the invention as defined in the appended claims.

What is claimed is:

1. Apparatus for converting a binary coded input signal to a binary coded decimal output signal having N decades comprisng N shift registers each having four bit positions, means for sequentially supplying the bits of the input signal to the least significant bit position of the register for the units decade of the binary coded decimal signal, the bits of the input signal being supplied in order to the least significant bit position of the units decade register with the most significant bit of the input signal being applied first, each of said registers having a right shift-parallel load most control input means, and means responsive to the sum of the value stored in each of said registers and the binary value 0011 for: (a) activating the mode control input means to shift the register contents one bit to the right in response to the sum being less than the binary value 1000, (b) activating the mode control input means to load the sum into the register in response to the sum being greater than to 1000, and (c) loading a binary one into the least significant bit position of the register for the adjacent higher decade in response to the sum being greater than 1000.

2. The apparatus of claim 1 wherein the means responsive to the sum of the value stored in each register and the binary value 0011 includes a binary full adder responsive to the binary bits stored in the register and a constant indicative of the binary value 0011, said adder including a most significant bit output and three less significant bit outputs, means for supplying the most significant bit output of the adder to the mode control input terminal and the least significant bit position of the register for the adjacent higher decade, and means for supplying the three less signficant bit outputs to the three most significant bit positions of the register.

3. The apparatus of claim 1 further including means for initially loading a binary zero into each position of each shift register, said means for initially loading including means for supplying a binary zero to the least significant bit position of each register while four clock pulses are supplied in parallel to the registers and the mode control input terminal of each register is activated to the right shift state.

4. The apparatus of claim 3 wherein the means for supplying a binary zero to the first position of the units register includes means for injecting four binary zeros before the most significant bit of the binary coded input signal.

5. The apparatus of claim 3 further including an AND gate responsive to the most significant bit output of the adder for selectively activating the means responsive to the sum of the value stored in each of the registers and the binary value 0011, and means for disabling the AND gate while the means for initially loading a binary zero into each position of each shift register is activated.

6. Apparatus for converting a binary coded input signal to a binary coded decimal output signal having N decades comprising N shift registers each having four bit positions, means for sequentially supplying the bits of the input signal to the least significant bit position of the register for the units decade of the binary coded decimal signal, the bits of the input signal being supplied in order to the least significant bit position of the units decade register with the most significant bit of the input signal being applied first, each of said registers having a right shift-parallel load mode control input means, and means for: (a) activating the mode control input means to shift the register contents one bit to the right in response to the most significant bit of the sum of the register contents and the binary value 0011 being a zero, (b) activating the mode control input means to add the binary value 0011 to the register contents in response to the most significant bit of the sum of the register contents and the binary value 0011 being a one, and (c) loading a binary one into the least significant bit position of the register for the adjacent higher decade in response to the most significant bit of the sum of the register contents and the binary value 0011 being a one.

7. Apparatus for converting a binary coded input signal to an output signal having a binary code of base K, wher K > 2, N orders of said output signal being provided, comprising N shift registers, one for each of said orders, each of said registers having M stages, where M is an integer enabling a binary signal to be represented in order K, means for sequentially supplying the bits of the input signal to the least significant bit position of the register for the lowest order of the output signal, the bits of the input signal being supplied in order to the least significant bit position of the lowest order register with the most significant bit being applied first, each of said registers having a right shift-parallel load mode control input means, and means for: (a) activating the mode control input means to shift the register contents one bit to the right in response to the most significant bit of the sum of the register contents and a predetermined binary value of $2M - K/2$ being a zero, (b) activating the mode control input means to add the predetermined binary value to the register contents in response to the most significant bit of the sum of the register contents and the predetermined binary value being a one, and (c) loading a binary one into the least significant bit position of the register for the adjacent higher order in response to the most significant bit of the sum of the register contents and the predetermined binary value being a one, said predetermined binary value being dependent upon the order K.

* * * * *